(12) United States Patent
Kamimura

(10) Patent No.: US 11,195,775 B2
(45) Date of Patent: Dec. 7, 2021

(54) SEMICONDUCTOR MODULE, SEMICONDUCTOR DEVICE, AND MANUFACTURING METHOD OF SEMICONDUCTOR MODULE

(71) Applicant: FUJI ELECTRIC CO., LTD., Kawasaki (JP)

(72) Inventor: Takeshi Kamimura, Okaya (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/884,187

(22) Filed: May 27, 2020

(65) Prior Publication Data

US 2021/0005528 A1 Jan. 7, 2021

(30) Foreign Application Priority Data

Jul. 3, 2019 (JP) .............................. JP2019-124453

(51) Int. Cl.
*H01L 23/367* (2006.01)
*H01L 23/40* (2006.01)
(Continued)

(52) U.S. Cl.
CPC .......... *H01L 23/3675* (2013.01); *H01L 21/56* (2013.01); *H01L 23/4006* (2013.01);
(Continued)

(58) Field of Classification Search
CPC . H01L 23/3675; H01L 23/4006; H01L 21/56; H01L 25/165; H01L 25/50; H01L 2023/4068
See application file for complete search history.

(56) References Cited

U.S. PATENT DOCUMENTS

| 5,920,119 | A  | * | 7/1999 | Tamba | .................... H01L 25/18 257/718 |
| 7,944,042 | B2 | * | 5/2011 | Yoshihara | ......... H01L 23/49861 257/693 |

(Continued)

FOREIGN PATENT DOCUMENTS

| JP | S62118453 U | 7/1987 |
| JP | 3021071 U | 2/1996 |

(Continued)

*Primary Examiner* — Peniel M Gumedzoe
(74) *Attorney, Agent, or Firm* — Rabin & Berdo, P.C.

(57) ABSTRACT

A semiconductor module includes an insulation circuit substrate in which circuit patterns are formed on an upper surface of an insulation plate, switching elements that are arranged on an upper surface of the circuit patterns, a first heat dissipation plate that is arranged on a lower surface of the insulation plate, a casing member that surrounds a periphery of the insulation circuit substrate, the switching elements, and the first heat dissipation plate such that a lower surface of the first heat dissipation plate is exposed, and a second heat dissipation plate that is arranged on an upper surface side of the switching elements such that a prescribed gap is provided. The casing member has notch portions having a depth corresponding to a thickness of the second heat dissipation plate. At least a portion of the second heat dissipation plate engages with the notch portions.

13 Claims, 9 Drawing Sheets

(51) Int. Cl.
*H01L 21/56* (2006.01)
*H01L 25/00* (2006.01)
*H01L 25/16* (2006.01)

(52) U.S. Cl.
CPC ............ *H01L 25/165* (2013.01); *H01L 25/50* (2013.01); *H01L 2023/4068* (2013.01)

(56) References Cited

U.S. PATENT DOCUMENTS

2006/0012032 A1\* 1/2006 Paulus .............. H01L 23/49861
    257/706
2019/0109059 A1\* 4/2019 Ohara ................... H01L 23/053

FOREIGN PATENT DOCUMENTS

| | | |
|---|---|---|
| JP | H09199645 A | 7/1997 |
| JP | 2004095697 A | 3/2004 |
| JP | 2008004788 A | 1/2008 |
| JP | 2011199044 A | 10/2011 |
| JP | 2013016606 A | 1/2013 |
| WO | 2016162991 A1 | 10/2016 |

\* cited by examiner

SEMICONDUCTOR MODULE, SEMICONDUCTOR DEVICE, AND MANUFACTURING METHOD OF SEMICONDUCTOR MODULE

BACKGROUND OF THE INVENTION

Field of the Invention

The present invention relates to a semiconductor module, a semiconductor device, and a manufacturing method of a semiconductor module.

Description of the Related Art

A semiconductor device has a substrate provided with a semiconductor element such as an insulated gate bipolar transistor (IGBT), a power metal oxide semiconductor field effect transistor (MOSFET), or a freewheeling diode (FWD) and is used for an inverter device and so forth.

This kind of semiconductor device employs a certain kind of cooling structure in consideration of an influence of heat that is generated to the semiconductor element depending on a use environment or the like. For example, in Japanese Patent Laid-Open No. 2013-16606, a heat dissipator is provided on a lower surface of a power module, and a heat dissipation plate is provided on an upper surface of the power module.

In International Publication No. WO 2016/162991, a heat sink is provided on an upper surface of a semiconductor element (power element), and a spacer of a metal plate is provided on a lower surface of the semiconductor element. The semiconductor element is held between the heat sink and the spacer.

SUMMARY OF THE INVENTION

Incidentally, in a heat dissipation structure of a semiconductor module in related art, a cooling effect may be obtained to a certain extent on one surface side by a heat sink provided to the one surface (front surface) of the semiconductor module. However, there is a problem that in a case where no particular cooling measure is taken, the temperature of another surface (back surface) of the semiconductor module rises more than the one surface side and the life of a product is thereby influenced.

In this case, although making the heat sink larger or making a chip size larger is possible, it is anticipated that balancing cost with thermal performance becomes difficult. It is also possible to provide a heat dissipation plate (spacer) on a surface on the opposite side to the heat sink as described above. However, a printed substrate is arranged on the surface on the opposite side. In particular, in International Publication No. WO 2016/162991, because the spacer is connected with the printed substrate, heat of the spacer is transmitted to the printed substrate, and an influence of lowering of reliability of the printed substrate is anticipated. It is difficult to secure a creepage distance, a clearance distance, or the like between a terminal connected with the printed substrate and the spacer, and insulation design may become difficult.

The present invention has been made in consideration of such a point, one of objects is to provide a semiconductor module, a semiconductor device, and a manufacturing method of a semiconductor module, in which a proper heat dissipation characteristic may be obtained while a creepage distance is secured without a size increase.

A semiconductor module of one aspect of the present invention includes: an insulation circuit substrate having an insulating plate and a circuit pattern formed on an upper surface of the insulation plate; a semiconductor element disposed on an upper surface of the circuit pattern; a first heat dissipation plate disposed on a lower surface opposite to the upper surface of the insulation plate; a casing member that surrounds peripheries of the insulation circuit substrate, the semiconductor element and the first heat dissipation plate, such that a lower surface of the first heat dissipation plate is exposed to an outside of the casing member; and a second heat dissipation plate disposed at an upper side of the semiconductor element opposite to a lower side of the semiconductor element at which the first heat dissipation plate is disposed, such that a prescribed gap is provided between the second heat dissipation plate and the semiconductor element. The casing member has a recess portion having a depth from an upper surface of the casing member, the depth of the recess portion corresponding to a thickness of the second heat dissipation plate, and at least a portion of the second heat dissipation plate engages with the recess portion.

A semiconductor device of one aspect of the present invention includes: the semiconductor module; and a cooling apparatus that is attached to an exposed surface of the first heat dissipation plate, in which the second heat dissipation plate is connected with the cooling apparatus.

A manufacturing method of a semiconductor module of one aspect of the present invention includes: preparing a casing member that surrounds a periphery of an insulation circuit substrate; arranging a first heat dissipation plate, with a heat dissipation surface being exposed and the insulation circuit substrate in the casing member; arranging a semiconductor element on an upper surface of the insulation circuit substrate; arranging a second heat dissipation plate so as to cover the semiconductor element; and filling with a sealing resin a space defined by the casing member. The casing member has a recess having a depth from an upper surface of the casing member, the depth of the recess portion corresponding to a thickness of the second heat dissipation plate, the arranging the second heat dissipation plate includes arranging the second heat dissipation plate such that a prescribed gap is provided between the second heat dissipation plate and the semiconductor element by engagement of at least a portion of the second heat dissipation plate with the recess portion, and the filling with a sealing resin a space includes fixing the casing member and the second heat dissipation plate together by sealing of at least a portion of the prescribed gap between the semiconductor element and the second heat dissipation plate.

In the present invention, a proper heat dissipation characteristic may be obtained while a creepage distance is secured without a size increase.

DETAILED DESCRIPTION OF THE PREFERRED EMBODIMENTS

Figure 1:
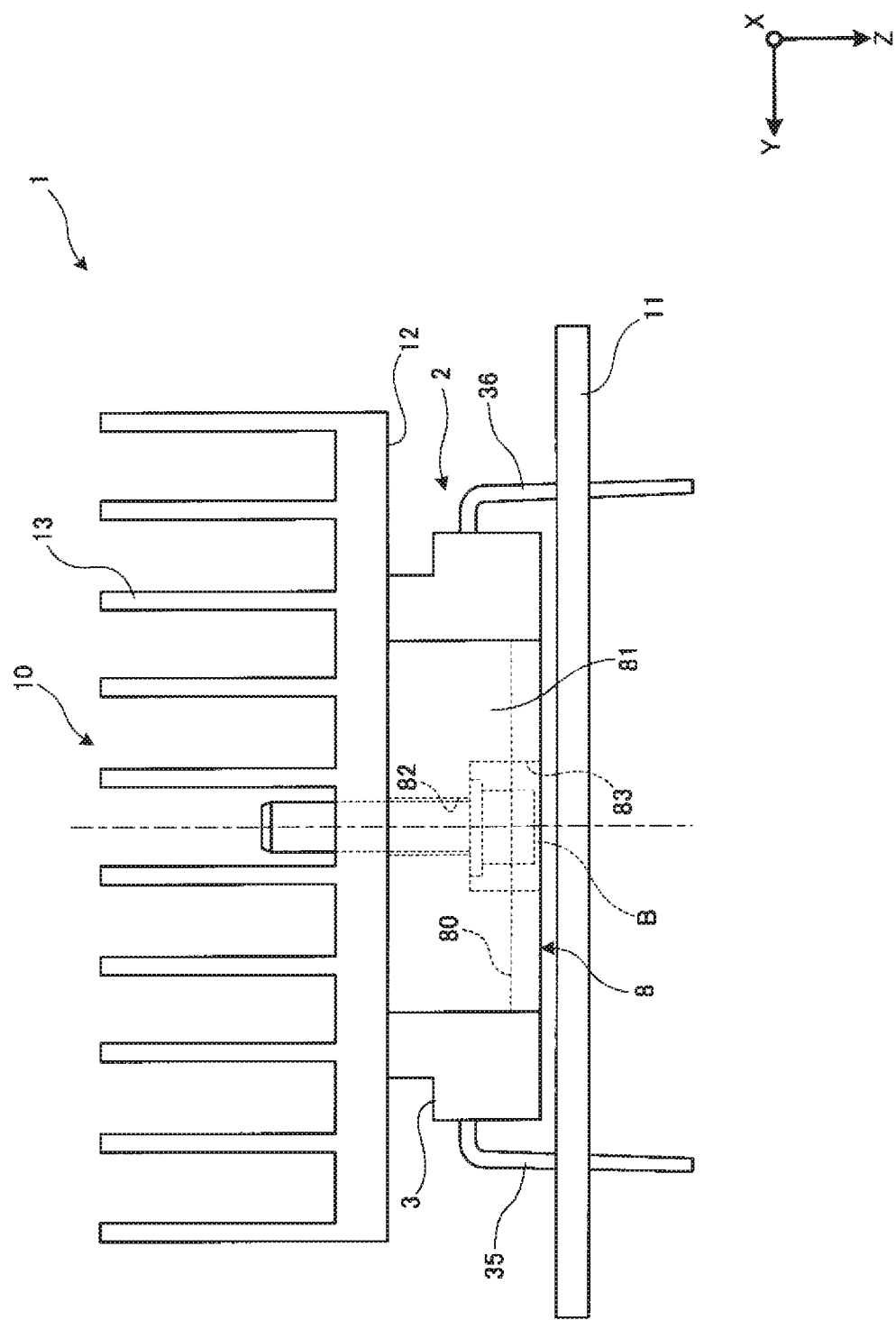
FIG. 1 is a side view of a semiconductor device according to this embodiment as seen in the longitudinal direction.
Figure 2:
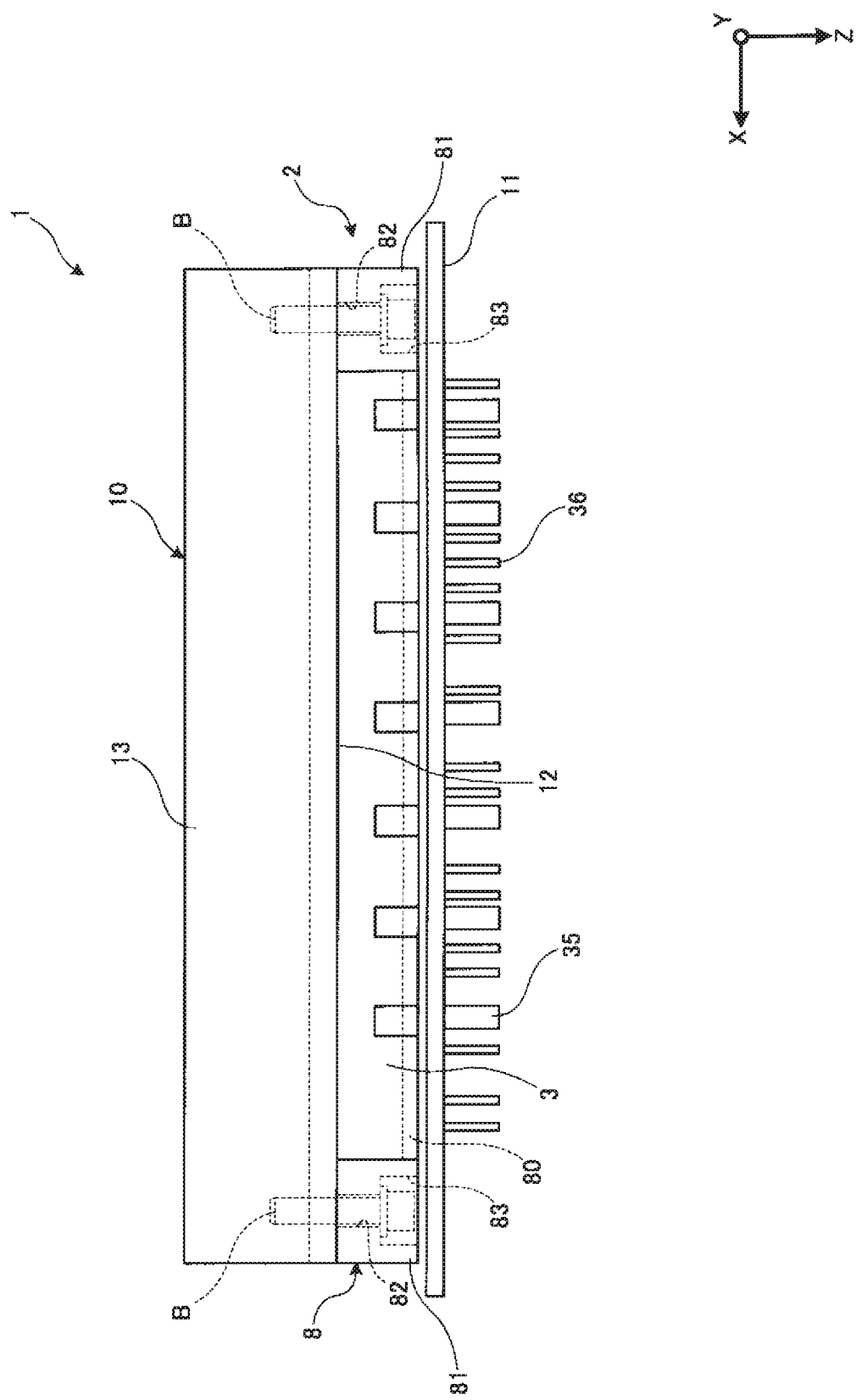
FIG. 2 is a side view of the semiconductor device according to this embodiment as seen in the lateral direction.
Figure 3:
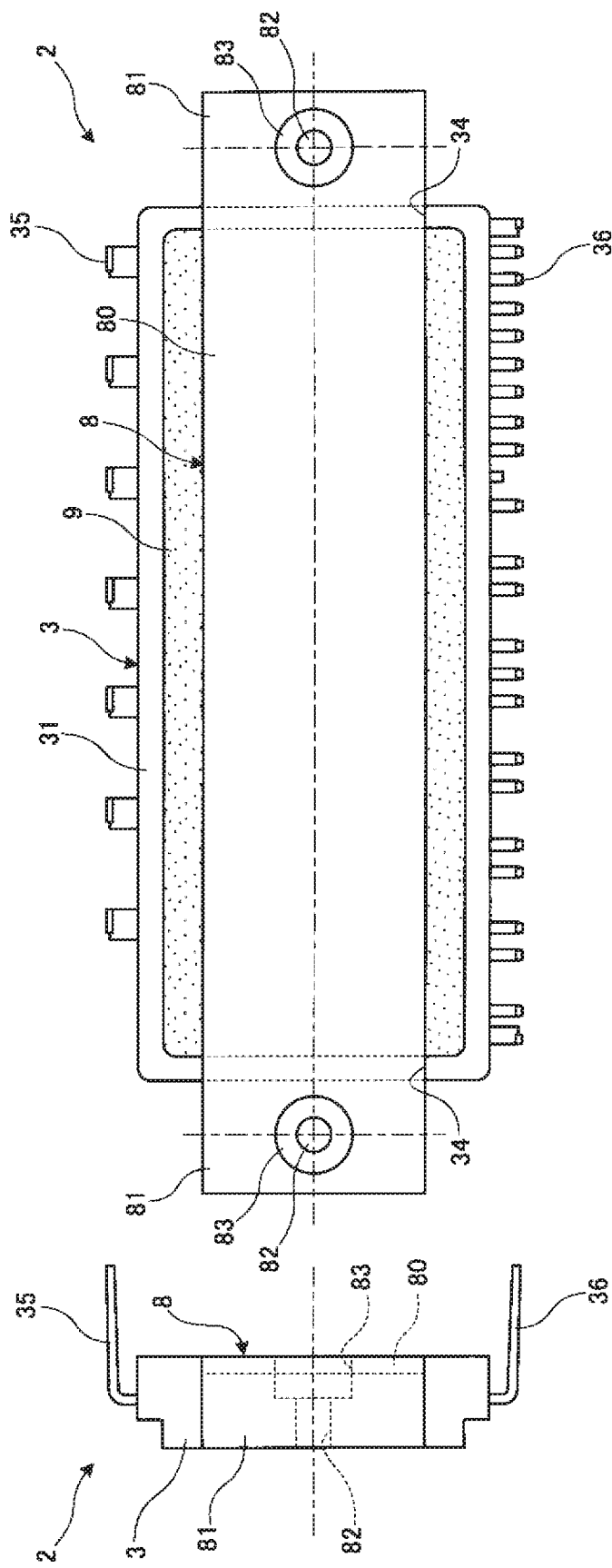
FIG. 3 shows a side view and a plan view of a semiconductor module according to this embodiment.
Figure 4:
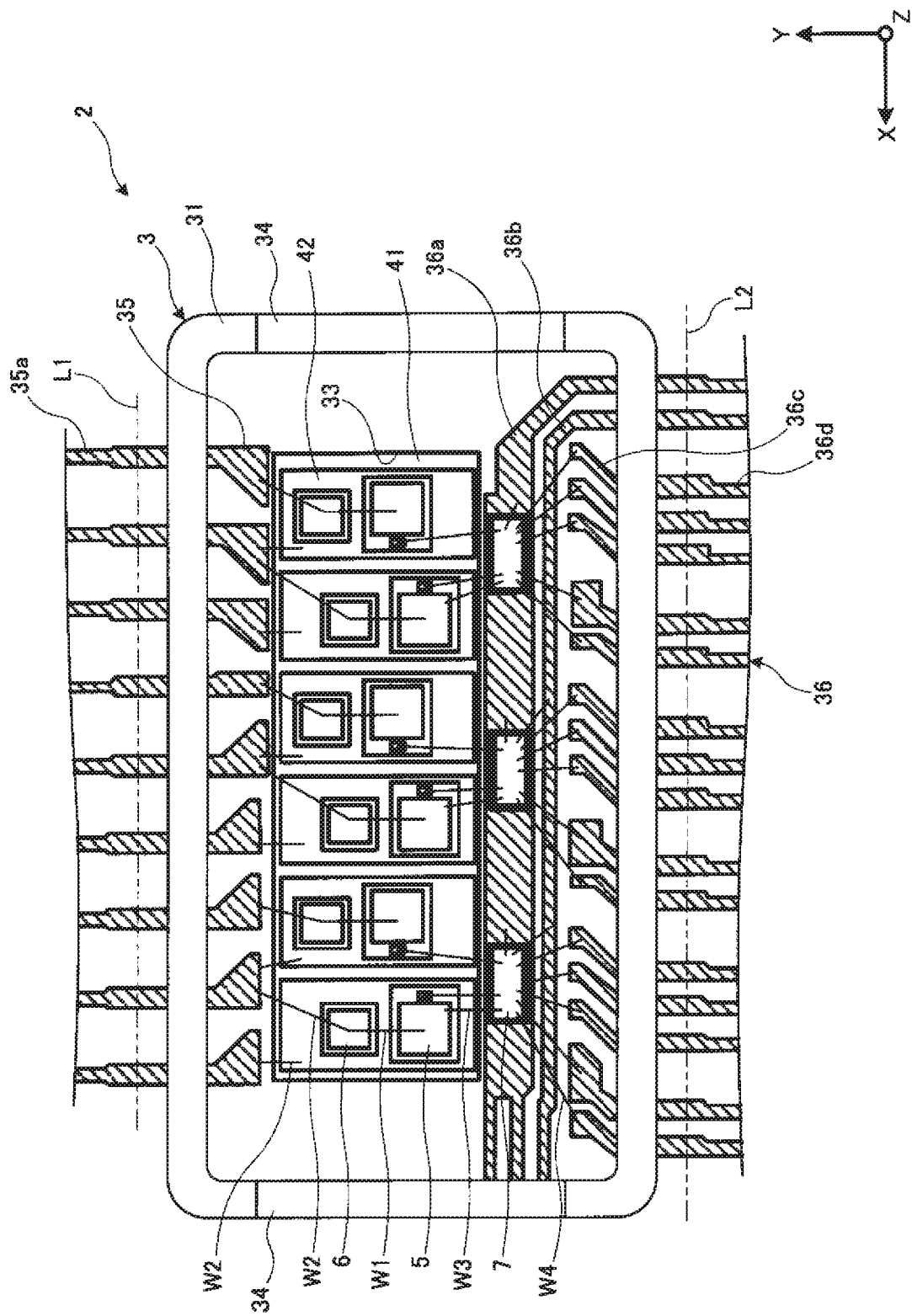
FIG. 4 is a plan view that illustrates an internal structure of the semiconductor module according to this embodiment.
Figure 5:
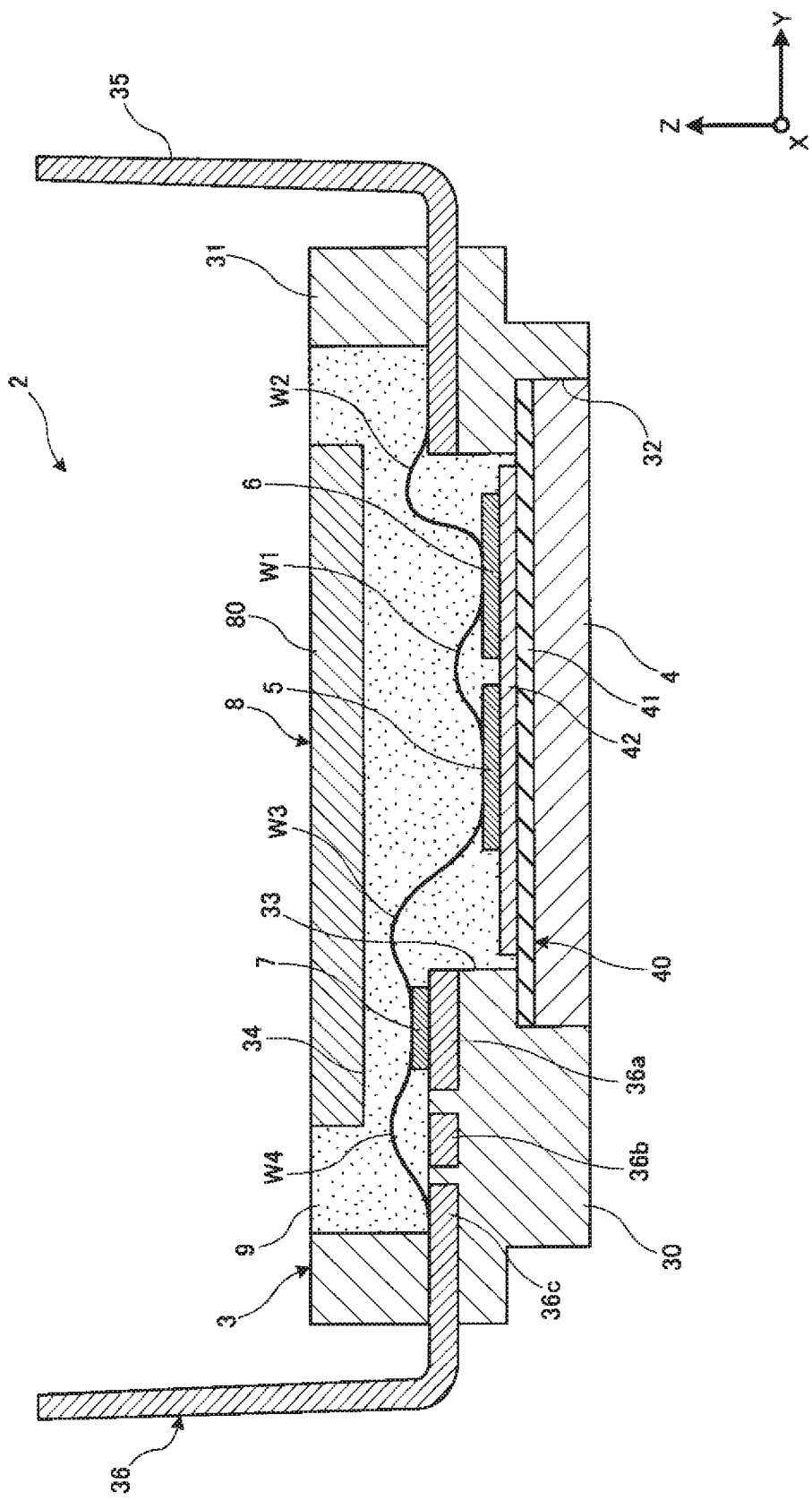
FIG. 5 is a cross-sectional view of the semiconductor module according to this embodiment.
Figure 6:
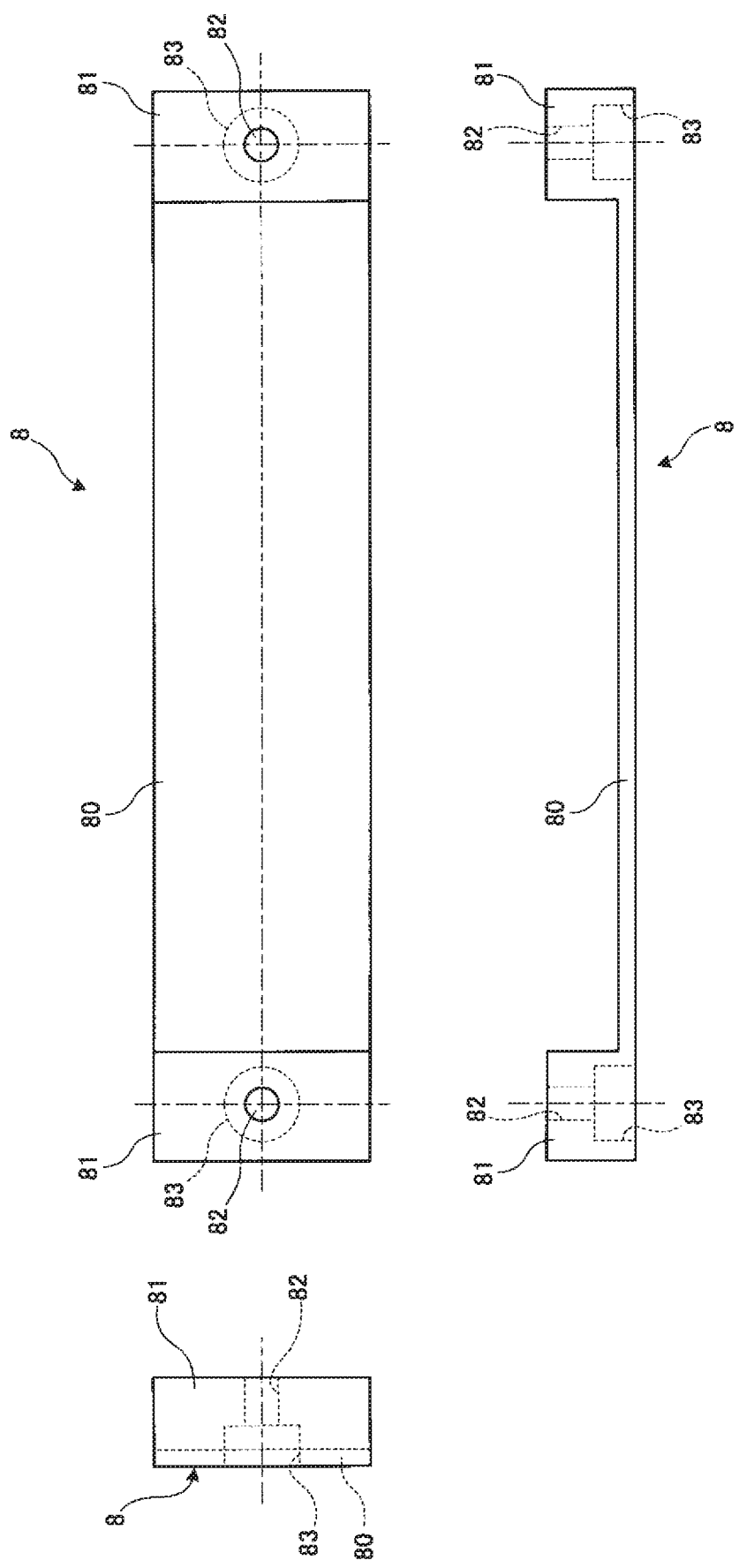
FIG. 6 shows three orthographic views that illustrate a second heat dissipation plate according to this embodiment.

A semiconductor device and a semiconductor module to which the present invention is applicable will hereinafter be described. FIG. 1 is a side view of the semiconductor device according to this embodiment as seen in the longitudinal direction. FIG. 2 is a side view of the semiconductor device according to this embodiment as seen in the lateral direction. FIG. 3 shows a side view and a plan view of the semiconductor module according to this embodiment. FIG. 4 is a plan view that illustrates an Internal structure of the semiconductor module according to this embodiment. FIG. 5 is a cross-sectional view of the semiconductor module according to this embodiment. FIG. 6 shows three orthographic views that illustrate a second heat dissipation plate according to this embodiment. Note that the semiconductor device and the semiconductor module, which are described in the following, are merely examples. The present invention is not limited to those, and appropriate alterations are possible.

In the following drawings, the longitudinal direction of the semiconductor device is defined as X direction, the lateral direction is defined as Y direction, and the height direction is defined as Z direction. Depending on cases, the X direction may be referred to as front-rear direction, the Y direction may be referred to as left-right direction, and the Z direction may be referred to as up-down direction. Those directions (the front-rear, left-right, and up-down directions) are wordings used for convenience of description, and their correspondence relationships with the X, Y, and Z directions may change depending on an attachment attitude of the semiconductor device. For example, a heat dissipation surface side (cooling apparatus side) of the semiconductor device will be referred to as upper surface side, and a control board side will be referred to as lower surface side. In this specification, a planar view means a case where an upper surface of the semiconductor device is seen from the positive direction of a Z axis. Note that FIG. 1 and FIG. 2 are illustrated upside down for convenience of description.

First, a semiconductor device 1 will be described. The semiconductor device 1 is applied to a power conversion device such as a power module, for example. As illustrated in FIG. 1 and FIG. 2, the semiconductor device 1 is configured to include a semiconductor module 2, a cooling apparatus 10, and a control board 11.

The cooling apparatus 10 is configured with a heat sink and has a rectangular shape in the planar view, for example. The cooling apparatus 10 has a smooth joining surface 12, to which one surface (lower surface) of the semiconductor module 2 is joined, on an upper surface. The joining surface 12 has a sufficiently larger area than an exposed surface of the semiconductor module 2, which will be described later. On the opposite side of the joining surface 12, plural fins 13 that stand in the Z direction are formed. In the cooling apparatus 10, an attachment hole (screw hole) for attaching the semiconductor module 2 may be formed.

The cooling apparatus 10 is formed of a metal such as copper or aluminum or an alloy that includes one or more kinds of such metals, and a plating process is applied to a surface, for example. Although details will be described later, the cooling apparatus 10 is attached to the semiconductor module 2 while the joining surface 12 is opposed to the exposed surface (heat dissipation surface) of the semiconductor module 2 and a compound with high thermal conductivity is interposed between the cooling apparatus 10 and the semiconductor module 2. Note that the cooling apparatus 10 is not limited to the above configuration but may be configured with a water-cooled cooling apparatus that includes a water jacket.

The control board 11 is a so-called printed substrate and has a rectangular shape in the planar view, which is slightly larger than the semiconductor module 2. In the control board 11, plural through holes (not illustrated) are formed which pass through in the thickness direction. Terminal members (main terminal 35 and control terminal 36) of the semiconductor module 2 are inserted in the through holes. Although details will be described later, the control board 11 is arranged to be opposed to another surface (an upper surface of a second heat dissipation plate 8) of the semiconductor module 2. A prescribed gap is formed between the second heat dissipation plate 8 and the control board 11.

Next, the semiconductor module 2 will be described. As illustrated in FIG. 3 to FIG. 6, the semiconductor module 2 is configured such that a first heat dissipation plate 4, an insulation circuit substrate 40, plural semiconductor elements (switching elements 5 and 6), plural integrated circuits 7, and the second heat dissipation plate 8 are arranged in a casing member 3. In particular, separately from the first heat dissipation plate 4 arranged on one surface side (lower surface side) of the casing member 3, the semiconductor module 2 includes the second heat dissipation plate 8 arranged on another surface side (upper surface side) of the casing member 3. The second heat dissipation plate 8 will be described later.

The first heat dissipation plate 4 serves as a base plate of the insulation circuit substrate 40 and is formed with a metal plate with proper thermal conductivity such as copper or aluminum and into a rectangular shape in the planar view, which is long in the X direction. The first heat dissipation plate 4 is arranged while being offset from the center of the semiconductor module 2 in the Y direction toward one side (main terminal side). Although details will be described later, a lower surface of the first heat dissipation plate 4 has an exposed surface that is exposed from the casing member 3 and is an attachment surface of the cooling apparatus 10.

The insulation circuit substrate 40 is arranged on an upper surface (main surface) of the first heat dissipation plate 4. The insulation circuit substrate 40 is configured with a direct copper bonding (DCB) substrate, an active metal brazing (AMB) substrate, or a metal base substrate, for example, and is formed into an oblong shape in the planar view, which is long in the X direction. The insulation circuit substrate 40 is configured by laminating a metal layer and an insulation layer. Specifically, the insulation circuit substrate 40 has an insulation plate 41 (which may be referred to as insulation layer or insulation film) that has an upper surface and a lower surface and plural circuit patterns 42 formed on the upper surface (main surface) of the insulation plate 41.

The insulation plate 41 is formed into a rectangular shape in the planar view which is a similar shape to the first heat dissipation plate 4 and is arranged so as to cover the whole upper surface of the first heat dissipation plate 4. The insulation plate 41 is formed of an insulation material such as a ceramic material such as alumina ($Al_2O_3$), aluminum nitride (AlN), or silicon nitride ($Si_3N_4$), a resin material such as epoxy, or an epoxy resin material that uses a ceramic material as a filler, for example.

The circuit pattern 42 is configured with a metal layer with a prescribed thickness which is formed of copper foil or the like. The circuit pattern 42 is formed into a rectangular shape in the planar view, which is long in the Y direction. The plural (six in FIG. 4) circuit patterns 42 are arranged side by side in the longitudinal direction of the insulation plate 41. The circuit patterns 42 are arranged on the insulation plate 41 in a state where those are electrically insulated from each other.

The insulation circuit substrate 40 configured in such a manner is arranged on the upper surface of the first heat dissipation plate 4 via a joining member (not illustrated) such as solder, for example.

Two semiconductor elements are arranged on an upper surface of each of the circuit patterns 42. The semiconductor element is electrically connected with each of the circuit patterns 42 via a joining member (not illustrated) such as solder. The semiconductor element is formed with a semiconductor substrate of silicon (Si), silicon carbide (SiC), or the like, for example, and into an oblong shape in the planar view. As the semiconductor element, a switching element such as an insulated gate bipolar transistor (IGBT) or a power metal oxide semiconductor field effect transistor (MOSFET) or a diode such as a freewheeling diode (FWD) is used.

On an upper surface of the semiconductor element, an input electrode (anode electrode) as a main electrode, which is not illustrated, is provided. On a lower surface of the semiconductor element, an output electrode (cathode electrode) as a main electrode, which is not illustrated, is provided. The lower surface of the semiconductor element is electrically joined with the upper surface of the circuit pattern 42 via a joining member (not illustrated) such as solder, for example.

In this embodiment, with respect to one circuit pattern 42, one switching element 5 configured with an IGBT element and one switching element 6 configured with an FWD element are arranged side by side in the Y direction. Specifically, the switching element 5 is arranged on a control terminal side of the circuit pattern 42 (a lower side of the page of FIG. 4), and the switching element 6 is arranged on a main terminal side of the circuit pattern 42 (an upper side of the page of FIG. 4). Note that the arrangement of the switching elements 5 and 6 are not limited to this. For example, the switching element 5 may be arranged on the main terminal side, and the switching element 6 may be arranged on the control terminal side.

In this embodiment, a configuration is made in which as the semiconductor elements, the IGBT element (switching element 5) and the FWD element (switching element 6) as a pair are arranged side by side. However, the semiconductor elements are not limited to those, and a reverse conducting (RC)-IGBT in which an IGBT element and an FWD element are integrated together, a reverse blocking (RB)-IGBT that has a sufficient withstand voltage against a reverse bias, or the like may be used. The shape of the semiconductor element, the number of arranged semiconductor elements, sections for arrangement, and so forth may appropriately be changed.

As described above, the semiconductor module 2 includes the casing member 3 that surrounds the first heat dissipation plate 4, the insulation circuit substrate 40, and the switching elements 5 and 6. The casing member 3 is formed into a rectangular frame shape in the planar view, which is long in the X direction. The casing member 3 is shaped with a synthetic resin or the like, for example. The casing member 3 is integrally molded with terminal members which will be described later.

The casing member 3 has a bottom wall portion 30 in a rectangular shape in the planar view and an annular wall portion 31 that stands upward from an outer peripheral edge on the bottom wall portion 30 and surrounds an outer periphery of the various configurations described above. The bottom wall portion 30 has a rectangular hole 32 formed to have a prescribed depth from a lower surface side and an opening 33 that opens corresponding to the plural circuit patterns 42.

The rectangular hole 32 is formed into a rectangular shape in the planar view, which corresponds to the shapes of the insulation plate 41 and of the first heat dissipation plate 4 arranged on the lower surface of the insulation plate 41. The opening 33 is configured with a pass-through hole in a rectangular shape in the planar view, which is contiguous with an upper surface of the rectangular hole 32 and is formed so as to expose the plural circuit patterns 42. The opening 33 is formed to be a little smaller than the rectangular hole 32. The depth of the rectangular hole 32 corresponds to the combined thickness of the thickness of the first heat dissipation plate 4 and the thickness of the insulation plate 41. That is, the rectangular hole 32 has a size that is capable of housing the first heat dissipation plate 4 and the insulation plate 41.

As illustrated in FIG. 5, in a state where the first heat dissipation plate 4 and the insulation plate 41 (insulation circuit substrate 40) are housed in the rectangular hole 32, the circuit patterns 42 (and the switching elements 5 and 6) are positioned in the opening 33 on the upper surface side. Meanwhile, the lower surface of the first heat dissipation plate 4 is exposed from the bottom wall portion 30 on a lower surface side. That is, the lower surface of the first heat dissipation plate 4 is the exposed surface (heat dissipation surface) that is exposed from the casing member 3. In addition, a lower surface of the bottom wall portion 30 and the exposed surface (heat dissipation surface) of the first heat dissipation plate 4 are flush with each other.

A pair of notch portions 34 are formed on upper surfaces of the annular wall portion 31, which are opposed to each other in the longitudinal direction of the casing member 3. Although details will be described later, the pair of notch portions 34 configure engaging portions (recess portions) with which the second heat dissipation plate 8 is capable of engaging. The notch portions 34 each have a depth same as the thickness of the second heat dissipation plate 8, as explained later.

As described above, in the casing member 3, the terminal members are embedded by integral molding. Specifically, the terminal members are configured with the main terminal 35 and the control terminal 36. The main terminal 35 and the control terminal 36 are configured with plate-shaped lead frames formed of metal materials such as a copper material, a copper-alloy-based material, an aluminum-alloy-based material, and an iron-alloy-based material.

The main terminal 35 and the control terminal 36 are embedded in the bottom wall portion 30 such that main surfaces are flush with a bottom surface (upper surface) of the bottom wall portion 30. The main terminal 35 and the control terminal 36 are arranged to be opposed to each other such that the opening 33 is interposed between those in the Y direction. On a lateral side of the switching element 6, the main terminal 35 extends outward in the Y direction along the bottom surface of the bottom wall portion 30 and further extends while passing through the annular wall portion 31. In addition, plural main terminals 35 are arranged side by side in the X direction along an outer edge of the opening 33.

On the outside of the annular wall portion 31, the main terminal 35 is provided with a narrow width portion 35a in which the width in the X direction becomes narrower. The narrow width portion 35a has a width which is capable of being inserted in the through hole of the control board 11. The main terminal 35 is curved upward at a general right angle on the outside of the annular wall portion 31. Specifically, as illustrated in FIG. 4, the main terminal 35 is bent upward in the Z direction along a bending line L1 positioned on the inside in the Y direction of a base end portion of the narrow width portion 35a on the outside of the annular wall portion 31. Note that FIG. 4 shows a drawing in which the terminal members are not bent yet. The base end portion of the narrow width portion 35a serves to define an insertion depth of the main terminal 35 with respect to the control board 11, that is, a gap between the control board 11 and the semiconductor module 2.

The control terminal 36 has two control terminals 36a and 36b arranged on a lateral side of the switching element 5 and plural control terminals 36c arranged on the outside of the control terminal 36b. The control terminals 36a and 36b extend in the longitudinal direction (X direction) of the opening 33 along the bottom surface of the bottom wall portion 30 and are formed into L shapes in the planar view, which are bent in the Y direction in an end portion of the casing member 3 and pass through the annular wall portion 31. The control terminal 36c extends outward in the Y direction along the bottom surface of the bottom wall portion 30 and further extends while passing through the annular wall portion 31. Plural control terminals 36c are arranged side by side in the X direction.

On the outside of the annular wall portion 31, the control terminal 36 is provided with a narrow width portion 36d in which the width in the X direction becomes narrower. The narrow width portion 36d has a width which is capable of being inserted in the through hole of the control board 11. The control terminal 36 is curved upward at a general right angle on the outside of the annular wall portion 31, similarly to the main terminal 35. Specifically, as illustrated in FIG. 4, the control terminal 36 is bent upward in the Z direction along a bending line L2 positioned on the inside in the Y direction of a base end portion of the narrow width portion 36d on the outside of the annular wall portion 31. The base end portion of the narrow width portion 36d serves to define an insertion depth of the control terminal 36 with respect to the control board 11, that is, a gap between the control board 11 and the semiconductor module 2.

In such a manner, the terminal members (main terminal 35 and control terminal 36) are bent so as to protrude from an outer surface of the casing member 3 (annular wall portion 31) toward the control board 11. A tip end of each of the terminal members is inserted in the through hole of the control board 11. Accordingly, the control board 11 is electrically connected with each of the terminal members such that a prescribed gap is formed between the control board 11 and the second heat dissipation plate 8.

The integrated circuits 7 that control driving of the semiconductor elements are arranged on an upper surface (main surface) of the control terminal 36a. As the integrated circuits 7, control ICs such as a high voltage integrated circuit (HVIC) and a low voltage integrated circuit (LVIC) and a diode such as a bootstrap diode (BSD) are used. The integrated circuit 7 is formed into a rectangular shape in the planar view, for example. Three integrated circuits 7 are arranged at prescribed intervals on the upper surface of the control terminal 36a which extends in the X direction. Note that the shape of the integrated circuit 7, the number of arranged integrated circuits 7, sections for arrangement, and so forth are not limited to the above-described example but may appropriately be changed.

The above-described switching elements 5 and 6, circuit patterns 42, integrated circuits 7, main terminals 35, and control terminals 36 are electrically connected together by wiring members. Specifically, the switching element 5 and the switching element 6 are electrically connected together by a wiring member W1. The switching element 5 and the main terminal 35 or the circuit pattern 42 and the main terminal 35 are electrically connected together by a wiring member W2. The switching element 5 and the integrated circuit 7 are electrically connected together by a wiring member W3. The integrated circuit 7 and the control terminal 36 are electrically connected together by a wiring member W4.

As the above-described wiring members W1 to W4, conductive wires are used. As a material of the conductive wire, any one of gold, copper, aluminum, a gold alloy, a copper alloy, and an aluminum alloy or a combination of those may be used. Members other than the conductive wire may be used as the wiring member. For example, a ribbon may be used as the wiring member.

The second heat dissipation plate 8 that covers a large portion of an upper opening of the annular wall portion 31 is arranged in an upper portion of the casing member 3. As illustrated in FIG. 5 and FIG. 6, the second heat dissipation plate 8 has a flat plate portion 80 that extends in the X direction and a pair of fixing portions 81 that protrude from both ends of the flat plate portion 80 in the Z direction.

The flat plate portion 80 is a plate-shaped body with a prescribed thickness and has a width that covers an upper area of the switching elements 5 and 6 in the Y direction. The flat plate portion 80 may also have a width that covers an upper area of the integrated circuits 7 in the Y direction. More specifically, the width of the flat plate portion 80 in the Y direction corresponds to the widths of the notch portions 34 and is the width at which the flat plate portion 80 and the notch portions 34 just fit (engage) together. The thickness of the flat plate portion 80 in the Z direction corresponds to the depths of the notch portions 34. As illustrated in FIG. 5, in a state where the flat plate portion 80 engages with the notch portions 34, an upper surface of the flat plate portion 80 and the upper surface of the annular wall portion 31 are flush with each other. The flat plate portion 80 extends to the outside of the width of the casing member 3 (annular wall portion 31) in the X direction.

The fixing portion 81 is for fixing the second heat dissipation plate 8 to the cooling apparatus 10. The fixing portion 81 has an almost rectangular cuboid shape that protrudes from an end portion of the flat plate portion 80 in the X direction toward the lower surface side of the semiconductor module 2 in the Z direction. The width of the fixing portion 81 in the Y direction is the same width as the flat plate portion 80. An inside surface of the fixing portion 81 in the X direction is capable of abutting an outside surface of the annular wall portion 31 in the X direction. As illustrated in FIG. 3 and FIG. 6, the pair of fixing portions 81 are arranged so as to be opposed to each other across the casing member 3 in the Y direction.

At the center of the width of the fixing portion 81 in the Y direction, a pass-through hole 82 is formed which passes through the fixing portion 81 in the thickness direction (Z direction). A counterbore hole 83 concentric with the pass-through hole 82 is formed in an upper surface of the fixing portion 81 on the side which is contiguous with the flat plate portion 80. The counterbore hole 83 is formed to have a larger diameter than the pass-through hole 82 and a pre-scribed depth. The depth of the counterbore hole 83 is preferably a depth in which a screw head of a bolt B for fixing, which will be described later, is accommodated. An end surface of the fixing portion 81 on the opposite side from the counterbore hole 83 is capable of abutting the joining surface 12 of the cooling apparatus 10.

The second heat dissipation plate 8 configured in such a manner is arranged on the upper surface side of the switching elements 5 and 6 such that a prescribed gap is provided. The second heat dissipation plate 8 is preferably formed with a metal material with proper thermal conductivity such as copper or aluminum. The second heat dissipation plate 8 may be shaped integrally with the flat plate portion 80 and the pair of the fixing portions 81 or may be joined to the flat plate portion 80 and the pair of fixing portions 81 by welding or the like.

An internal space of the casing member 3 which is defined by the annular wall portion 31 is filled with a sealing resin 9. As illustrated in FIG. 5, filling with the sealing resin 9 is performed such that an upper surface of the sealing resin 9 reaches the upper surface of the annular wall portion 31 and the upper surface of the second heat dissipation plate 8. Accordingly, the insulation circuit substrate 40, the switching elements 5 and 6, the integrated circuits 7, and the wiring members W1 to W4 are sealed. Note that as the sealing resin 9, an epoxy resin or a silicone gel may be used.

The present invention is not limited to the above configuration, and a full-mold structure is possible in which the casing member 3 and the sealing resin 9 are integrated together. In this case, the casing member 3 forms the annular wall portion 31 of the semiconductor module and also seals the insulation circuit substrate 40, the switching elements 5 and 6, the integrated circuits 7, and the wiring members W1 to W4. In the semiconductor module 2, the annular wall portion 31 is formed with the casing member 3, the second heat dissipation plate 8 is exposed on a portion of the upper surface, the first heat dissipation plate 4 is exposed on a portion of the lower surface, and the terminal members (main terminals 35 and control terminals 36) extend outward from two side surfaces opposed to each other. Such a full-mold structure formed with the casing member 3 integrated with the sealing resin 9 may be formed by transfer molding or the like. Note that for the casing member 3 integrated with the sealing resin 9, an epoxy resin is preferably used.

In the semiconductor module 2 configured in such a manner, the cooling apparatus 10 is attached to the heat dissipation surface (exposed surface) of the first heat dissipation plate 4. Screw holes (not illustrated) corresponding to the pass-through holes 82 of the fixing portions 81 are formed in the joining surface 12 of the cooling apparatus 10. The bolts B are inserted in and through the pass-through holes 82 from the fixing portion 81 side, tip portions of the bolts B are screwed into the cooling apparatus 10, and the semiconductor module 2 and the cooling apparatus 10 are thereby integrally fixed together. Here, because a head portion of the bolt B is accommodated in the counterbore hole 83, the bolt B does not stick out from the fixing portion 81.

Incidentally, in a common cooling structure of a semiconductor module in related art, a cooling apparatus is usually attached on a metal substrate (insulation circuit substrate) side on which a semiconductor element as a heat generating component is mounted.

However, in association with recent size reduction and capacity enlargement of semiconductor modules, it has been found that a temperature rise on a resin surface (a surface of a resin on the side on which the semiconductor element is covered by a sealing resin) on the opposite side to the metal substrate is a problem, which has not been considered as a problem in related art. That is, it has turned out by experiments that the temperature becomes higher on the resin surface on a back side of the semiconductor module than the surface temperature of the metal substrate or the temperature of a solder portion of a terminal. Because a measure against the temperature on the resin surface side is not taken in related art, there are concerns that in a case where thermal design is made while the surface temperature of the metal substrate or the temperature of the solder portion of the terminal is used as a reference, an excessive temperature rise of the resin surface causes an influence on the life of the semiconductor module.

Although making a heat sink larger or making a chip size larger is possible as a common measure, it is anticipated that balancing cost with thermal performance becomes difficult. It is also possible to provide a heat dissipation plate (spacer) on a surface on the opposite side to the heat sink. However, because a printed substrate is arranged on the surface on the opposite side and heat of the spacer is transmitted to the printed substrate, an influence of lowering of reliability of the printed substrate is anticipated. Further, it is difficult to secure a creepage distance, a clearance distance, or the like between a terminal connected with the printed substrate and the spacer, and insulation design may become difficult.

Accordingly, the inventor of the present invention has focused on necessity of a certain measure against heat on a resin surface side of a semiconductor module and conceived the present invention. Specifically, in this embodiment, a configuration is made in which the second heat dissipation plate 8 is arranged above the switching elements 5 and 6 separately from the first heat dissipation plate 4 arranged below the switching elements 5 and 6. That is, the switching elements 5 and 6 are in a positional relationship in which those are interposed between the first heat dissipation plate 4 and the second heat dissipation plate 8.

The second heat dissipation plate 8 is arranged so as to cover the upper surface side of the switching elements 5 and 6 such that a prescribed gap is provided. The sealing resin 9 is present between the switching elements 5 and 6 and the second heat dissipation plate 8. In addition, the notch portions 34 as recess portions that correspond to the thickness of the second heat dissipation plate 8 (flat plate portion 80) are provided to the annular wall portion 31. At least a portion of the second heat dissipation plate 8 (both end portions of the flat plate portion 80) engages with the notch portions 34. The second heat dissipation plate 8 is connected with the joining surface 12 of the cooling apparatus 10 via the fixing portions 81.

By those configurations, heat of the switching elements 5 and 6 may be dissipated not only from the first heat dissipation plate 4 to the cooling apparatus 10 but also from the second heat dissipation plate 8 to the cooling apparatus 10. Thus, it is possible to inhibit an excessive temperature rise on the resin surface side (sealing resin 9 side), which has been a problem in related art. Consequently, it is possible to obtain a proper heat dissipation characteristic without increasing the chip size or the size of the cooling apparatus 10.

The control board 11 is arranged to be opposed to the upper surface side of the second heat dissipation plate 8. The second heat dissipation plate 8 engages with the notch portions 34 and thus does not protrude from the upper surface (the upper surface of the annular wall portion 31) of the semiconductor module 2. Thus, it is possible to form a prescribed gap between the control board 11 and the flat plate portion 80. Because the second heat dissipation plate 8 and the control board 11 are not directly connected together, heat of the second heat dissipation plate 8 is not directly transmitted to the control board 11. Thus, it is possible to inhibit lowering of reliability of the control board 11. Because the distance between the terminal members (main terminals 35 and control terminals 36) and the second heat dissipation plate 8 may be extended, insulation design is possible in which a creepage distance, a clearance distance, or the like is secured. In such a manner, in this embodiment, a proper heat dissipation characteristic may be obtained while a creepage distance is secured without a size increase. In addition, the second heat dissipation plate 8 may be arranged so as to cover an upper surface side of the integrated circuits 7 such that a prescribed gap is provided. Accordingly, it is possible to dissipate heat of the switching elements 5 and 6, which is transmitted to the integrated circuit 7 side via the sealing resin 9, from the second heat dissipation plate 8 to the cooling apparatus 10. Thus, malfunction and failure of the integrated circuit 7 due to overheating may be inhibited.

The second heat dissipation plate 8 has the flat plate portion 80 that covers the upper area of the switching elements 5 and 6 and the pair of fixing portions 81 that are provided to the end portions of the flat plate portion 80 and are capable of abutting the cooling apparatus 10. The pair of fixing portions 81 are fixed to the cooling apparatus 10 via the bolts B. In this configuration, it is possible to firmly fix the semiconductor module 2 and the cooling apparatus 10 together by fastening forces of the bolts B such that the casing member 3 is interposed between the second heat dissipation plate 8 and the cooling apparatus 10. In particular, because the fixing portions 81 are provided to the second heat dissipation plate 8, it is not necessary to provide a space for fastening a bolt for the casing member 3. As a result, a configuration of the casing member 3 is simplified, and it is possible to effectively use a space in the casing member 3 or to reduce the size of the casing member 3.

Next, a manufacturing method of a semiconductor module according to one aspect of the present invention will be described with reference to FIG. 7 to FIG. 12. FIG. 7 to FIG. 12 are schematic diagrams that illustrate examples of steps of a manufacturing method of a semiconductor module according to this embodiment. Note that the manufacturing method of the semiconductor module, which will be described in the following, is merely an example. The present invention is not limited to this configuration, and appropriate alterations are possible.

A manufacturing method of the semiconductor module 2 according to this embodiment includes: a preparation step of preparing the casing member 3 (see FIG. 7); a substrate arrangement step of arranging the first heat dissipation plate 4, with the heat dissipation surface being exposed, and the insulation circuit substrate 40 in the casing member 3 (see FIG. 8); a semiconductor element arrangement step of arranging the semiconductor elements or the like on an upper surface of the insulation circuit substrate 40 (see FIG. 9); a wiring member arrangement step of arranging the wiring members (see FIG. 10); a second heat dissipation plate arrangement step of arranging the second heat dissipation plate 8 (see FIG. 11); and a sealing step of performing filling with the sealing resin 9 (see FIG. 12), in this order.

Figure 7:
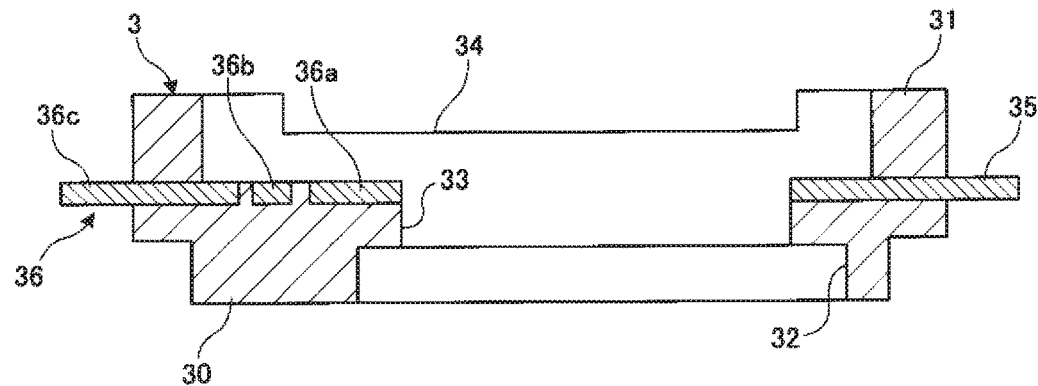
FIG. 7 is a schematic diagram that illustrates an example of one step of a manufacturing method of the semiconductor module according to this embodiment.

As illustrated in FIG. 7, first, the casing member 3 that is in advance integrally molded with the terminal members is prepared (preparation step). As described above, in the casing member 3, the rectangular hole 32, the opening 33, and the notch portions 34 are formed.

Figure 8:
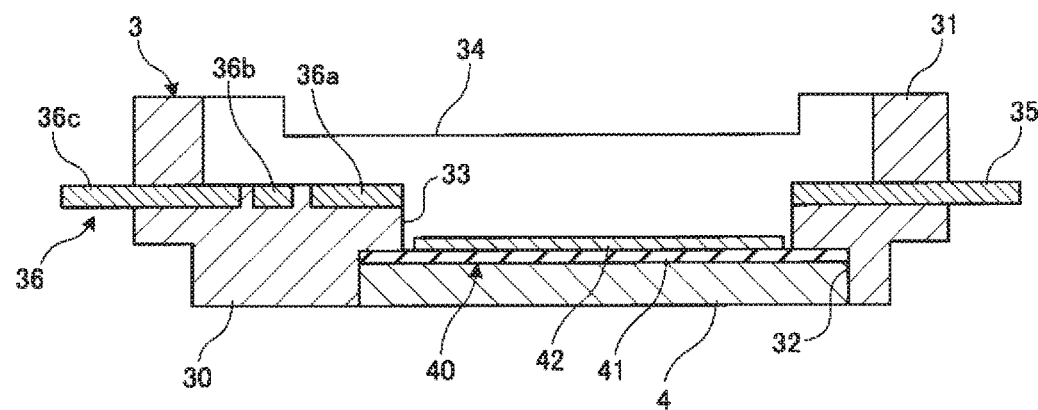
FIG. 8 is a schematic diagram that illustrates an example of one step of the manufacturing method of the semiconductor module according to this embodiment.

Next, the substrate arrangement step is conducted. As illustrated in FIG. 8, in the substrate arrangement step, the first heat dissipation plate 4 on whose upper surface the insulation circuit substrate 40 is arranged is arranged in a prescribed section of the casing member 3. Specifically, the insulation circuit substrate 40 and the first heat dissipation plate 4 are accommodated in the rectangular hole 32. Here, the circuit patterns 42 are in a state where those are exposed on the upper surface side of the casing member 3 through the opening 33. The lower surface (heat dissipation surface) of the first heat dissipation plate 4 and the lower surface of the casing member 3 (bottom wall portion 30) are flush with each other.

Figure 9:
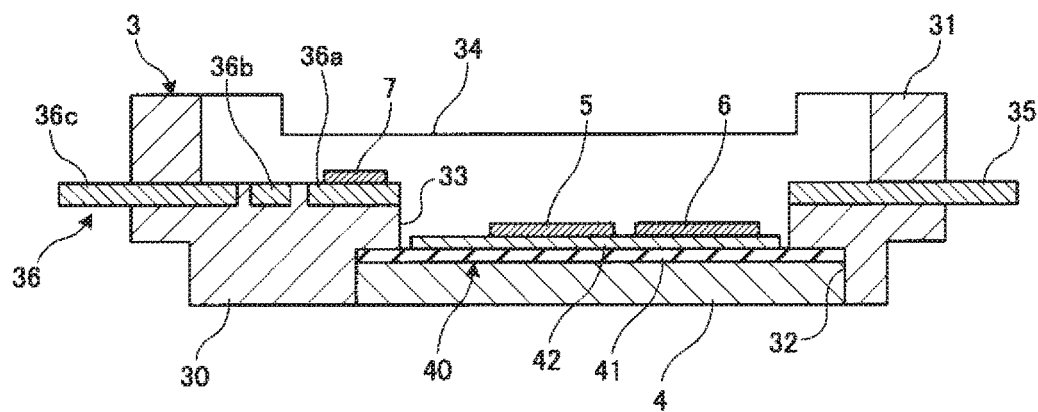
FIG. 9 is a schematic diagram that illustrates an example of one step of the manufacturing method of the semiconductor module according to this embodiment.

Next, the semiconductor element arrangement step is conducted. As illustrated in FIG. 9, in the semiconductor element arrangement step, the switching elements 5 and 6 are arranged on the upper surface of the circuit patterns 42, and the integrated circuits 7 are arranged on the upper surface of the control terminal 36a. Note that the mounting order of chips may appropriately be changed.

Figure 10:
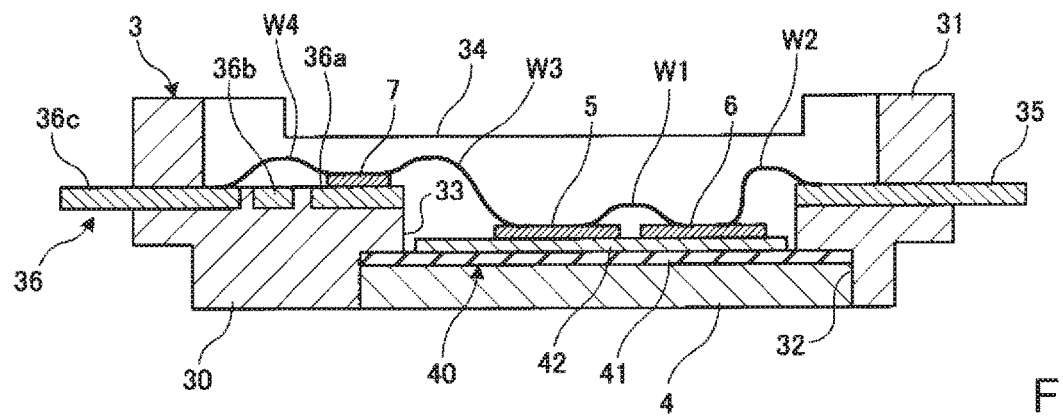
FIG. 10 is a schematic diagram that illustrates an example of one step of the manufacturing method of the semiconductor module according to this embodiment.

Next, the wiring member arrangement step is conducted. As illustrated in FIG. 10, in the wiring member arrangement step, chips, chips and terminal members, or chips and circuit patterns are electrically connected by prescribed wiring members W1 to W4 (wire bonding). Note that the mounting order of the wiring members (the order of wire bonding) may appropriately be changed.

Figure 11:
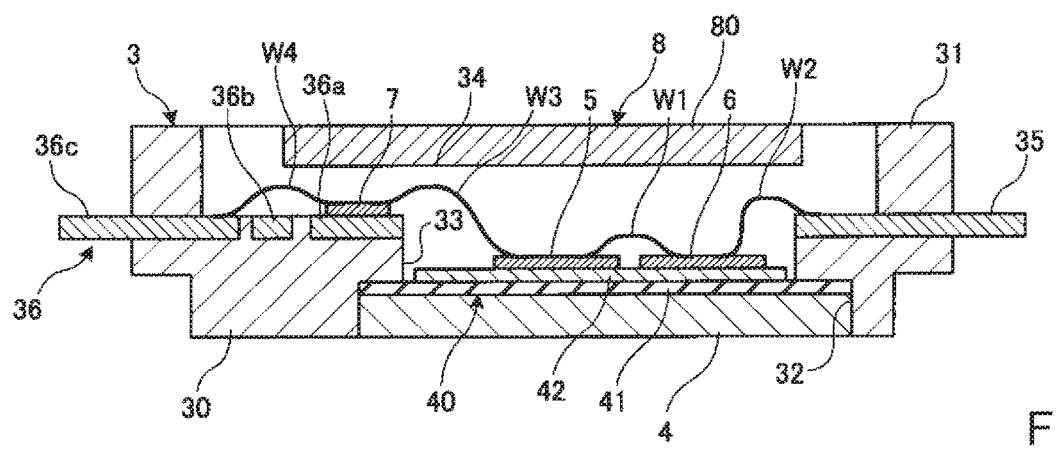
FIG. 11 is a schematic diagram that illustrates an example of one step of the manufacturing method of the semiconductor module according to this embodiment.

Next, the second heat dissipation plate arrangement step is conducted. As illustrated in FIG. 11, in the second heat dissipation plate arrangement step, the second heat dissipation plate 8 is arranged so as to cover the upper area of the switching elements 5 and 6. Specifically, the second heat dissipation plate 8 is arranged in a prescribed section by interposing the casing member 3 between the pair of fixing portions 81 and by engaging the flat plate portion 80 with the notch portions 34. Here, the flat plate portion 80 is arranged such that a prescribed gap is provided between the flat plate portion 80 and the switching elements 5 and 6. The upper surface of the flat plate portion 80 and the upper surface of the annular wall portion 31 are flush with each other.

Figure 12:
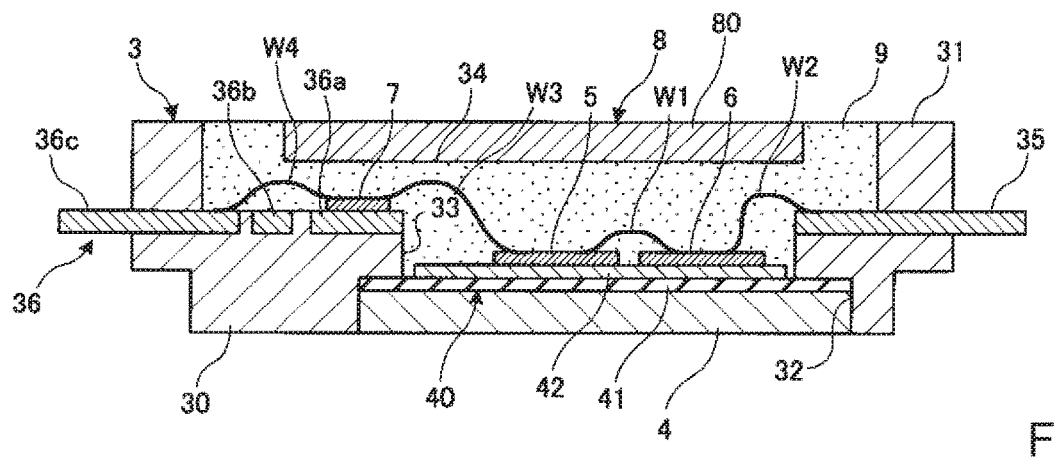
FIG. 12 is a schematic diagram that illustrates an example of one step of the manufacturing method of the semiconductor module according to this embodiment.

Next, the sealing step is conducted. As illustrated in FIG. 12, a space formed in the casing member 3 is filled with the sealing resin. The sealing resin 9 seals the insulation circuit substrate 40, the switching elements 5 and 6, the integrated circuits 7, and the wiring members W1 to W4. Filling with the sealing resin 9 is performed such that the upper surface of the sealing resin 9 reaches the upper surface of the annular wall portion 31 and the upper surface of the second heat dissipation plate 8. When the sealing resin 9 is cured, the casing member 3 and the second heat dissipation plate 8 are fixed together. Note that although not illustrated, after the sealing step, the terminal members (main terminals 35 and control terminals 36) are bent in prescribed directions. In such a manner, filling with the sealing resin 9 is performed after the second heat dissipation plate 8 is arranged in a prescribed section of the casing member 3, and the integrated semiconductor module 2 is thereby completed.

As described above, in the present invention, the second heat dissipation plate 8 is arranged above the switching elements 5 and 6 separately from the first heat dissipation plate 4 arranged below the switching elements 5 and 6, and the second heat dissipation plate 8 is directly fixed to the cooling apparatus 10. Accordingly, a proper heat dissipation characteristic may be obtained while a creepage distance is secured without a size increase of the module.

In the above embodiment, the numbers of switching elements 5 and 6 and integrated circuits 7 and sections for arrangement are not limited to the above configuration but may appropriately be changed. The number of arranged wiring members and the number of connection sections of the wiring members with respect to the circuit patterns may appropriately be changed, similarly.

In the above embodiment, the number and layout of circuit patterns 42 are not limited to the above configuration but may appropriately be changed.

In the above embodiment, a configuration is made such that the insulation circuit substrate 40 and the switching elements 5 and 6 are formed into rectangular shapes or oblong shapes in the planar view. However, the present invention is not limited to this configuration. The insulation circuit substrate 40 and the switching elements 5 and 6 may be formed into polygonal shapes other than the above shapes.

In the above embodiment, a configuration is made such that the second heat dissipation plate 8 is fixed to the cooling apparatus 10 via the bolts B. However, the present invention is not limited to this configuration. For example, the second heat dissipation plate 8 and the cooling apparatus 10 may be held and fixed between plate springs or the like.

Figure 13:
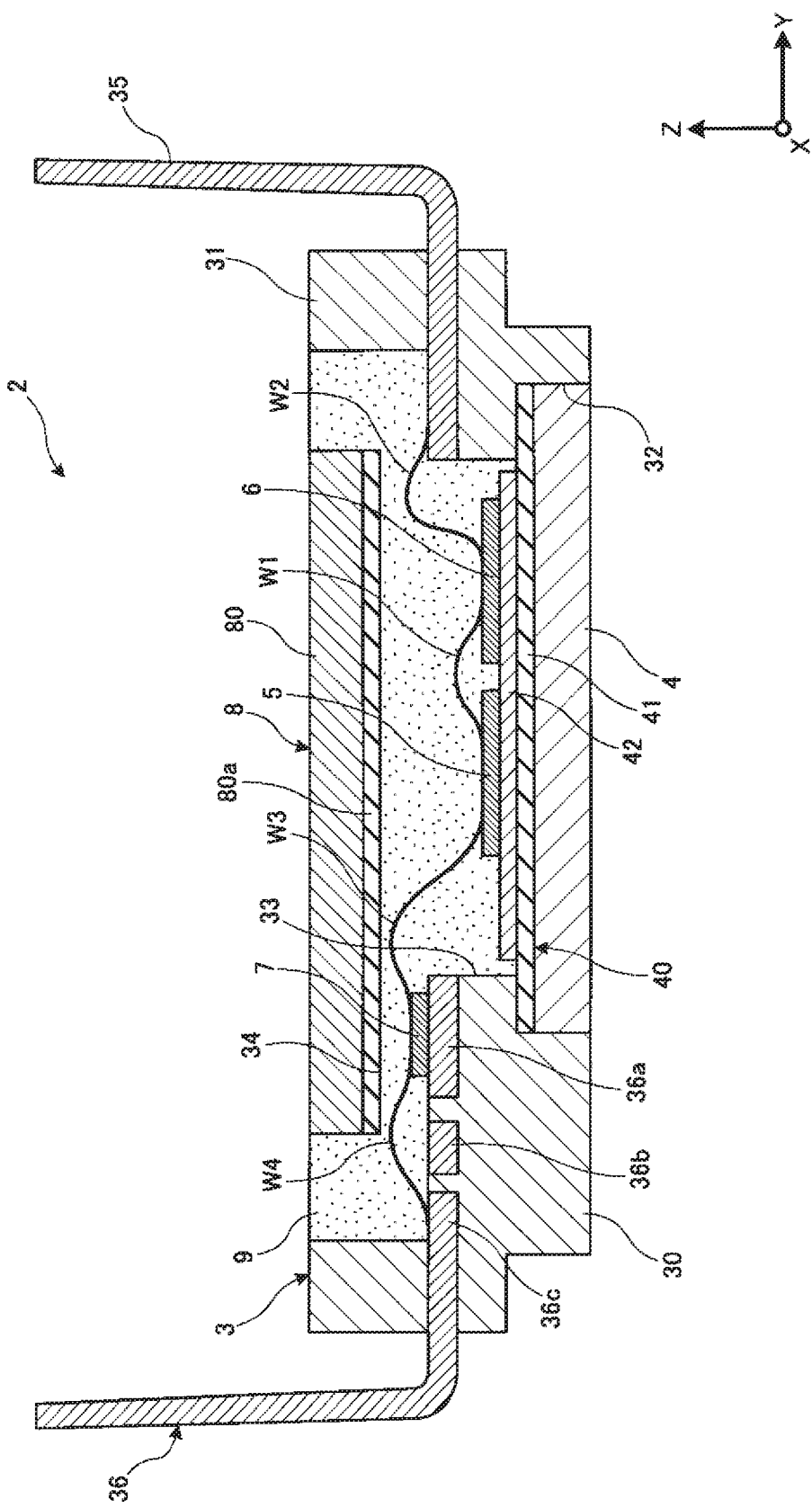
FIG. 13 is a cross-sectional view of a semiconductor module according to a modification example.

In the above embodiment, a description is made about a case where the flat plate portion 80 is arranged above the switching elements 5 and 6 via the sealing resin 9. However, the present invention is not limited to this configuration. For example, a configuration as in FIG. 13 is possible. FIG. 13 is a cross-sectional view of a semiconductor module according to a modification example. As illustrated in FIG. 13, an insulation layer 80a that contacts with the sealing resin 9 is arranged on a lower surface of the flat plate portion 80. That is, the flat plate portion 80 has the insulation layer 80a arranged between the flat plate portion 80 and the sealing resin 9 (the switching elements 5 and 6 and the wiring members W1 to W4). The insulation layer 80a is formed of an insulation material such as a ceramic material such as alumina ($Al_2O_3$), aluminum nitride (AlN), or silicon nitride ($Si_3N_4$), a resin material such as epoxy, or an epoxy resin material that uses a ceramic material as a filler, for example. The insulation layer 80a is preferably formed on the whole lower surface of the flat plate portion 80, for example. In this configuration, insulation between the flat plate portion 80 and the wiring members may be secured by the insulation layer 80a. As a result, it is possible to arrange the flat plate portion 80 closer to the switching elements 5 and 6 side. Thus, it is possible to realize size reduction by decreasing the thickness of the whole semiconductor module 2 in the Z direction.

Although this embodiment and the modification example are described, another embodiment may be made by wholly or partially combining the above embodiment and the modification example.

This embodiment is not limited to the above embodiment or the modification example but may variously be altered, substituted, and modified without departing from the scope of the gist of the technical ideas. In addition, if the technical ideas may be realized by another manner by development of techniques or other derived techniques, embodiments may be carried out by using such methods. Accordingly, the claims encompass all embodiments that may be included in the scope of the technical ideas.

In the following, characteristic points in the above embodiment will be summarized.

A semiconductor module described in the above embodiment includes: an insulation circuit substrate in which a circuit pattern is formed on an upper surface of an insulation plate; a semiconductor element that is arranged on an upper surface of the circuit pattern; a first heat dissipation plate that is arranged on a lower surface of the insulation plate; a casing member that surrounds a periphery of the insulation circuit substrate, the semiconductor element, and the first heat dissipation plate such that a lower surface of the first heat dissipation plate is exposed; and a second heat dissipation plate that is arranged on an upper surface side of the semiconductor element such that a prescribed gap is provided, in which the casing member has a recess portion that corresponds to a thickness of the second heat dissipation plate and at least a portion of the second heat dissipation plate engages with the recess portion.

The semiconductor module described in the above embodiment further includes a sealing resin with which a space defined by the casing member is filled and which seals at least a portion between the semiconductor element and the second heat dissipation plate.

A semiconductor device described in the above embodiment includes: the semiconductor module; and a cooling apparatus that is attached to an exposed surface of the first heat dissipation plate, in which the second heat dissipation plate is connected with the cooling apparatus.

The semiconductor device described in the above embodiment further includes a control board that is arranged to be opposed to the second heat dissipation plate, in which the semiconductor module includes a terminal member that protrudes from an outer surface of the casing member toward the control board and the control board is connected with the terminal member such that a prescribed gap is formed between the control board and the second heat dissipation plate.

In the semiconductor device described in the above embodiment, the second heat dissipation plate includes: a flat plate portion that covers an upper area of the semiconductor element; and a fixing portion that is provided to an end portion of the flat plate portion and is capable of abutting the cooling apparatus, and the fixing portion is fixed to the cooling apparatus via a bolt.

In the semiconductor device described in the above embodiment, the flat plate portion has an insulation layer that is arranged between the flat plate portion and the semiconductor element.

A manufacturing method of a semiconductor module described in the above embodiment includes: a preparation step of preparing a casing member that surrounds a periphery of an insulation circuit substrate; a substrate arrangement step of arranging a first heat dissipation plate, with a heat dissipation surface being exposed, and the insulation circuit substrate in the casing member; a semiconductor element arrangement step of arranging a semiconductor element on an upper surface of the insulation circuit substrate; a second heat dissipation plate arrangement step of arranging a second heat dissipation plate so as to cover the semiconductor element; and a sealing step of performing filling with a sealing resin in a space defined by the casing member, in which the casing member has a recess portion that corresponds to a thickness of the second heat dissipation plate, in the second heat dissipation plate arrangement step, the second heat dissipation plate is arranged such that a prescribed gap is provided between the second heat dissipation plate and the semiconductor element by engagement of at least a portion of the second heat dissipation plate with the recess portion, and in the sealing step, the casing member and the second heat dissipation plate are fixed together by sealing of at least a portion between the semiconductor element and the second heat dissipation plate.

INDUSTRIAL APPLICABILITY

As described in the foregoing, the present invention has an effect in which a proper heat dissipation characteristic may be obtained while a creepage distance is secured without a size increase and is useful particularly for a semiconductor module, a semiconductor device, and a manufacturing method of a semiconductor module.

REFERENCE SIGNS LIST 1 semiconductor device
2 semiconductor module
3 casing member
4 first heat dissipation plate
5 switching element (semiconductor element)
6 switching element (semiconductor element)
7 integrated circuit
8 second heat dissipation plate
9 sealing resin
10 cooling apparatus
11 control board
12 joining surface
13 fin
30 bottom wall portion
31 annular wall portion
32 rectangular hole
33 opening
34 notch portion (recess portion)
35 main terminal (terminal member)
35a narrow width portion
36 control terminal (terminal member)
36a control terminal (terminal member)
36b control terminal (terminal member)
36c control terminal (terminal member)
36d narrow width portion
40 insulation circuit substrate
41 insulation plate
42 circuit pattern
80 flat plate portion
80a insulation layer
81 fixing portion
82 pass-through hole
83 counterbore hole
B bolt
L1 bending line
L2 bending line
W1 wiring member
W2 wiring member
W3 wiring member
W4 wiring member

What is claimed is:

1. A semiconductor module, comprising:
an insulation circuit substrate having an insulating plate and a circuit pattern formed on an upper surface of the insulation plate;
a semiconductor element disposed on an upper surface of the circuit pattern;
a first heat dissipation plate disposed on a lower surface opposite to the upper surface of the insulation plate;
a casing member having a wall portion that surrounds peripheries of the insulation circuit substrate, the semiconductor element and the first heat dissipation plate, such that a lower surface of the first heat dissipation plate is exposed to an outside of the casing member; and
a second heat dissipation plate disposed at an upper side of the semiconductor element opposite to a lower side of the semiconductor element at which the first heat dissipation plate is disposed, such that a prescribed gap is provided between the second heat dissipation plate and the semiconductor element, wherein
the casing member has a recess portion having a depth from an upper surface of the casing member, the depth of the recess portion corresponding to a thickness of the second heat dissipation plate, the recess portion having a flat and continuous bottom surface and opposite side surfaces respectively provided at opposite ends of the bottom surface and being provided so as to penetrate through the wall portion of the case member so that the bottom surface and the side surfaces each have a width that is the same as a thickness of the wall portion, and
at least a portion of the second heat dissipation plate engages with the recess portion.

2. The semiconductor module according to claim 1, further comprising a sealing resin with which a space defined by the casing member is filled and which seals at least a portion of the prescribed gap between the semiconductor element and the second heat dissipation plate.

3. A semiconductor device, comprising:
the semiconductor module according to claim 1; and
a cooling apparatus that is attached to the lower surface of the first heat dissipation plate, wherein
the second heat dissipation plate is connected with the cooling apparatus.

4. The semiconductor device according to claim 3, further comprising
a control board that is disposed at a first side of the second heat dissipation plate, opposite to a second side of the second heat dissipation plate at which the first heat dissipation plate is disposed, wherein
the semiconductor module includes a terminal member that protrudes from an outer surface of the casing member toward the control board, and
the control board is connected to the terminal member such that a prescribed gap is formed between the control board and the second heat dissipation plate.

5. The semiconductor device according to claim 3, wherein
the second heat dissipation plate includes:
a flat plate portion that covers the upper side of the semiconductor element; and a fixing portion that is provided at an end of the flat plate portion and abuts the cooling apparatus, and the fixing portion is fixed to the cooling apparatus via a bolt.

6. The semiconductor device according to claim 5, wherein the second heat dissipation plate has an insulation layer disposed between the flat plate portion and the semiconductor element.

7. A manufacturing method of a semiconductor module, the method comprising:

preparing a casing member that surrounds a periphery of an insulation circuit substrate;

arranging a first heat dissipation plate, with a heat dissipation surface being exposed and the insulation circuit substrate in the casing member;

arranging a semiconductor element on an upper surface of the insulation circuit substrate;

arranging a second heat dissipation plate so as to cover the semiconductor element; and filling with a sealing resin a space defined by the casing member, wherein the casing member has a recess having a depth from an upper surface of the casing member, the depth of the recess portion corresponding to a thickness of the second heat dissipation plate, the arranging the second heat dissipation plate includes arranging the second heat dissipation plate such that a prescribed gap is provided between the second heat dissipation plate and the semiconductor element by engagement of at least a portion of the second heat dissipation plate with the recess portion, and the filling with a sealing resin a space includes fixing the casing member and the second heat dissipation plate together by sealing of at least a portion of the prescribed gap between the semiconductor element and the second heat dissipation plate.

8. A semiconductor module, comprising:

an insulation circuit substrate having an insulating plate and a circuit pattern formed on an upper surface of the insulation plate;

a semiconductor element disposed on an upper surface of the circuit pattern;

a first heat dissipation plate disposed on a lower surface opposite to the upper surface of the insulation plate;

a casing member that surrounds peripheries of the insulation circuit substrate, the semiconductor element and the first heat dissipation plate, such that a lower surface of the first heat dissipation plate is exposed to an outside of the casing member;

a second heat dissipation plate disposed at an upper side of the semiconductor element opposite to a lower side of the semiconductor element at which the first heat dissipation plate is disposed, such that a prescribed gap is provided between the second heat dissipation plate and the semiconductor element; and a sealing resin filling a space defined by the casing member, so as to come into contact with the second heat dissipation plate, wherein the casing member has a recess portion having a depth from an upper surface of the casing member, the depth of the recess portion corresponding to a thickness of the second heat dissipation plate, and at least a portion of the second heat dissipation plate engages with the recess portion.

9. The semiconductor module according to claim 8, wherein the sealing resin seals at least a portion of the prescribed gap between the semiconductor element and the second heat dissipation plate.

10. A semiconductor device, comprising:

the semiconductor module according to claim 8; and a cooling apparatus that is attached to the lower surface of the first heat dissipation plate, wherein the second heat dissipation plate is connected with the cooling apparatus.

11. The semiconductor device according to claim 10, further comprising a control board that is disposed at a first side of the second heat dissipation plate, opposite to a second side of the second heat dissipation plate at which the first heat dissipation plate is disposed, wherein the semiconductor module includes a terminal member that protrudes from an outer surface of the casing member toward the control board, and the control board is connected to the terminal member such that a prescribed gap is formed between the control board and the second heat dissipation plate.

12. The semiconductor device according to claim 10, wherein the second heat dissipation plate includes:

a flat plate portion that covers the upper side of the semiconductor element; and a fixing portion that is provided at an end of the flat plate portion and abuts the cooling apparatus, and the fixing portion is fixed to the cooling apparatus via a bolt.

13. The semiconductor device according to claim 12, wherein the second heat dissipation plate has an insulation layer disposed between the flat plate portion and the semiconductor element.

* * * * *